(12) United States Patent
Bulzacchelli et al.

(10) Patent No.: US 8,704,583 B2
(45) Date of Patent: Apr. 22, 2014

(54) CAPACITIVE LEVEL-SHIFTING CIRCUITS AND METHODS FOR ADDING DC OFFSETS TO OUTPUT OF CURRENT-INTEGRATING AMPLIFIER

(75) Inventors: John F. Bulzacchelli, Yonkers, NY (US); Steven M. Clements, Raleigh, NC (US); Sergey V. Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/399,054

(22) Filed: Feb. 17, 2012

(65) Prior Publication Data

US 2013/0214865 A1 Aug. 22, 2013

(51) Int. Cl.
*H03L 5/00* (2006.01)
*H03F 3/45* (2006.01)

(52) U.S. Cl.
USPC .......................................... 327/362; 327/336

(58) Field of Classification Search
USPC .................... 327/306, 333, 336, 362; 330/261
See application file for complete search history.

(56) References Cited

U.S. PATENT DOCUMENTS

| | | | |
|---|---|---|---|
| 4,520,489 A | 5/1985 | Hogge, Jr. | |
| 4,553,052 A * | 11/1985 | Takahashi | 327/65 |
| 5,381,053 A * | 1/1995 | Yasuda | 327/65 |
| 7,095,667 B2 * | 8/2006 | Baker | 365/207 |
| 7,511,549 B1 * | 3/2009 | Luo | 327/307 |
| 7,539,243 B1 | 5/2009 | Toifl et al. | |
| 7,817,714 B2 | 10/2010 | Bae et al. | |
| 2007/0064845 A1 | 3/2007 | Phanse et al. | |

OTHER PUBLICATIONS

H-J. Chi et al., "A 3.2Gb/s 8b Single-Ended Integrating DFE RX for 2-Drop DRAM Interface with Internal Reference Voltage and Digital Calibration," IEEE International Solid-State Circuits Conference (ISSCC), Digest of Technical Papers, Feb. 2008, pp. 112-113, 600.
L. Chen et al., "A Scalable 3.6-to-5.2mW 5-to-10Gb/s 4-Tap DFE in 32nm CMOS," IEEE International Solid-State Circuits Conference (ISSCC), Digest of Technical Papers, Feb. 2009, pp. 180-181.
J.F. Bulzacchelli et al., "A 78mW 11.1Gb/s 5-Tap DFE Receiver with Digitally Calibrated Current-Integrating Summers in 65nm CMOS," IEEE International Solid-State Circuits Conference (ISSCC), Digest of Technical Papers, Feb. 2009, pp. 368-369, 369a.

(Continued)

*Primary Examiner* — Dinh T. Le
(74) *Attorney, Agent, or Firm* — Anne V. Dougherty; Ryan, Mason & Lewis, LLP

(57) ABSTRACT

Capacitive level-shifting circuits and methods are provided for adding DC offsets to the output of a current-integrating amplifier. For example, a current-integrating amplifier includes an input amplifier stage and an output offset circuit. The input amplifier stage includes an input node, a first output node, and a first switch connected between the first output node and a power supply node. The output offset circuit is connected to the first output node of the input amplifier stage and to a second output node of the current-integrating amplifier. The output offset circuit includes a first series capacitor coupled between the first output node of the input amplifier stage and the second output node of the current-integrating amplifier. The output offset circuit switchably connects a bias voltage to the second output node and charges the first series capacitor to add a DC offset to the second output node of the current-integrating amplifier.

21 Claims, 14 Drawing Sheets

(56) References Cited

OTHER PUBLICATIONS

D.Z. Turker et al., "A 19Gb/s 38mW 1-Tap Speculative DFE Receiver in 90nm CMOS," Symposium on VLSI Circuits, Digest of Technical Papers, Jun. 2009, pp. 216-217.

S. Sidiropoulos et al., "A 700-Mb/s/pin CMOS Signaling Interface Using Current Integrating Receivers," IEEE Journal of Solid-State Circuits, May 1997, pp. 681-690, vol. 32.

M. Park et al., "A 7Gb/s 9.3mW 2-Tap Current-Integrating DFE Receiver," IEEE International Solid-State Circuits Conference (ISSCC), Feb. 2007, pp. 230-231.

* cited by examiner

20

22

60

70

US 8,704,583 B2

CAPACITIVE LEVEL-SHIFTING CIRCUITS AND METHODS FOR ADDING DC OFFSETS TO OUTPUT OF CURRENT-INTEGRATING AMPLIFIER

TECHNICAL FIELD

The field relates generally to analog amplifiers for signal processing and specifically to circuits and methods for adding DC offset voltages to the output of an amplifier based on current integration.

BACKGROUND

Signal amplification is one of the most fundamental functions performed in analog, mixed-signal, and radio-frequency (RF) electronic systems. At lower signal frequencies, high gain amplifiers can be implemented with circuit topologies commonly employed in the design of operational amplifiers (opamps), and the power dissipated by such amplifiers can be low (especially if the required bandwidth is much less than 100 MHz). However, opamp-like circuits do not provide enough bandwidth for handling higher signal frequencies (e.g., above a few GHz), so different amplifier topologies (usually open-loop types) are employed in these frequency ranges.

One of the most common examples of a wideband, open-loop amplifier used for multi-GHz frequencies is the resistor-loaded differential amplifier. The amplifier stage comprises a differential input stage formed by differential transistor pair, load resistors and tail bias current sources. This differential amplifier topology is often referred to as a current-mode logic (CML) stage since it is the basic building block in that family of logic. The bandwidth of this type of amplifier is often limited by the RC time constant at the output nodes, which must be minimized for high frequency applications by increasing the bias current. As a result, the power dissipation of the amplifier can be undesirably high when a very large bandwidth (e.g., 10 GHz) is needed.

A more power-efficient alternative to the resistor-loaded differential amplifier is a current-integrating amplifier in which the load resistors are replaced by resettable capacitors at each output node and transistor switches that are driven by a clock signal in order to effect charging and discharging of the capacitors during a reset phase and an integrating phase. Integrating currents on parasitic capacitances is fundamentally much more power efficient than resistive current-to-voltage conversion. With typical circuit parameters, the power dissipation of a current-integrating amplifier may be almost an order of magnitude lower than that of a resistively loaded amplifier. Current-integrating amplifier circuits are commonly employed in analog signal summation circuitry to enable signal summation with high power efficiency made possible by the use of the current-integrating circuits.

SUMMARY

Exemplary embodiments of the invention generally include circuits and methods for adding offset voltages to the output of an amplifier based on current integration. In particular, exemplary embodiments of the invention include capacitive level-shifting circuits and methods for adding DC offsets to the output of a current-integrating amplifier.

In one exemplary embodiment, a current-integrating amplifier circuit includes an input amplifier stage and an output offset circuit. The input amplifier stage includes an input node, a first output node, and a first switch connected between the first output node and a power supply node. The output offset circuit is connected to the first output node of the input amplifier stage and to a second output node of the current-integrating amplifier circuit. The output offset circuit includes a first series capacitor coupled between the first output node of the input amplifier stage and the second output node of the current-integrating amplifier circuit. The output offset circuit switchably connects a bias voltage to the second output node and charges the first series capacitor to add a DC offset to the second output node of the current-integrating amplifier circuit.

In another exemplary embodiment of the invention, the current-integrating amplifier circuit having the input amplifier stage and the output offset circuit is employed in an M-tap DFE (decision feedback equalizer) circuit, wherein the current-integrating amplifier circuit operates as a summer to add speculative DFE feedback taps as DC offsets to a received data signal.

These and other exemplary embodiments, aspects and features of the present invention will become apparent from the following detailed description of exemplary embodiments thereof, which is to be read in connection with the accompanying drawings.

DETAILED DESCRIPTION OF EXEMPLARY EMBODIMENTS

Exemplary embodiments will now be discussed in further detail with regard to circuits and methods for adding offset voltages to the output of an amplifier based on current integration and, in particular, capacitive level-shifting circuits and methods for adding DC offsets to the output of a current-integrating amplifier. Initially, various circuits to which principles of the invention may be applied will be discussed with reference to FIGS. 1-6.

Figure 1:
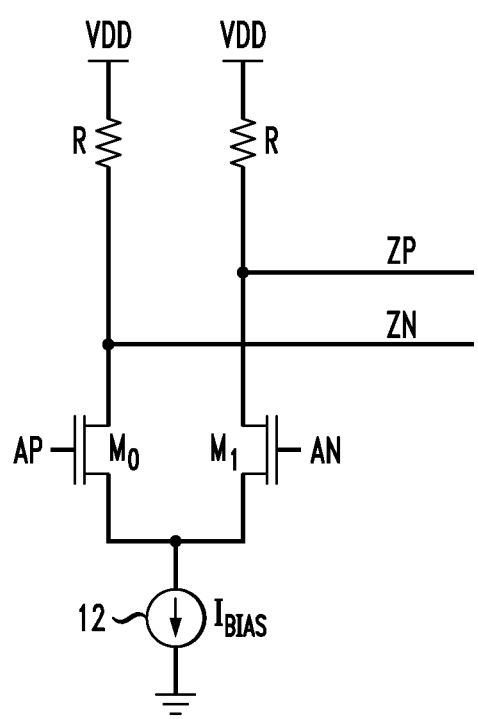
FIG. 1 is a schematic circuit diagram of a resistor-loaded differential amplifier.

FIG. 1 illustrates differential amplifier topology 10, which comprises a resistor-loaded current-mode logic (CML) stage. The amplifier stage 10 comprises a differential input stage formed by differential transistor pair M0 and M1 and load resistors R. The gates of transistors M0 and M1 (nodes AP and AN, respectively) are differential inputs that receive as input a differential voltage. The drains of transistors M0 and M1 (nodes ZN and ZP, respectively) are output nodes that output a differential voltage. The amplifier stage 10 further comprises a tail current source 12 that generates a bias current $I_{BIAS}$ for DC biasing the amplifier stage 10.

This differential amplifier topology 10 is often referred to as a current-mode logic (CML) stage since it is the basic building block in that family of logic. The bandwidth of this amplifier 10 is often limited by the RC time constant at the output nodes ZP and ZN. In order to maintain adequate circuit bandwidth, a small RC time constant is needed. Since the load capacitance is usually dictated by the application, the RC time constant can only be decreased by reducing the value of R. In order to preserve amplifier gain and develop adequate signal voltages at the amplifier output, the reduction in R must be accompanied by a commensurate increase in the bias current $I_{BIAS}$. As a result, the power dissipation of the amplifier 10 can be undesirably high when a very large bandwidth (e.g., 10 GHz) is needed.

Figure 2A:
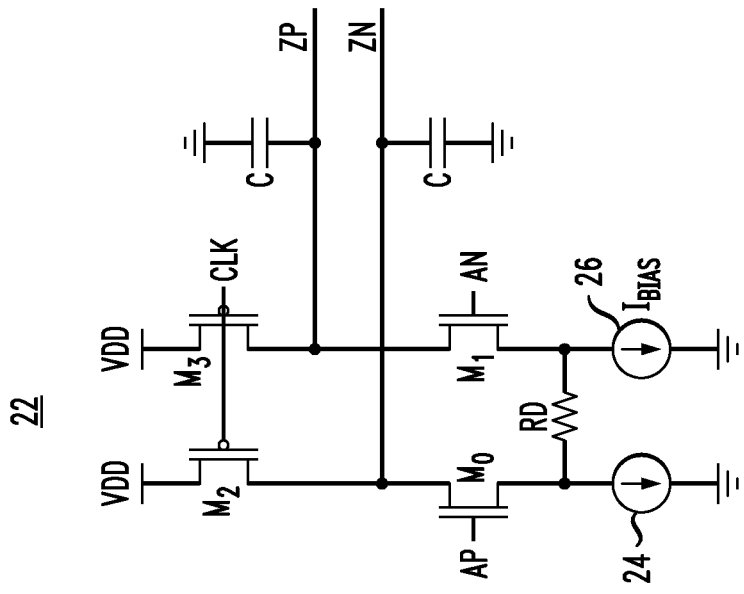
FIG. 2A is a schematic circuit diagram of a current-integrating amplifier.
Figure 3:
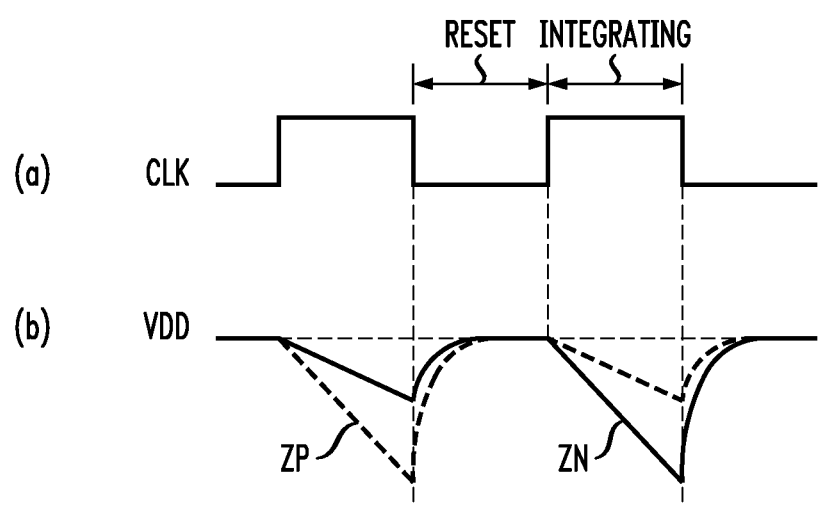
FIG. 3 depicts example waveforms that illustrate an operating mode of the current-integrating amplifier of FIG. 2A.

A more power-efficient alternative to the resistor-loaded differential amplifier 10 of FIG. 1 is a current-integrating amplifier, whose basic topology is shown in FIG. 2A. FIG. 2A illustrates a current-integrating amplifier 20 in which the load resistors are replaced by resettable capacitors C at each output node ZP and ZN, and PMOS switches M2 and M3 that are driven by a clock signal CLK. The capacitors are connected between the output nodes ZP and ZN and ground. For highest power efficiency, the capacitors C may be realized as parasitic capacitances of the wiring, devices, and load. FIG. 3 depicts exemplary waveform diagrams illustrating an operating mode of the current-integrating amplifier of FIG. 2A.

In FIG. 3, waveform (a) illustrates a clock signal CLK input to the gates of PMOS switches M2 and M3, and waveform (b) illustrates voltage waveforms at the output nodes ZP and ZN. As depicted in FIG. 3, when the clock signal CLK is low, the integrator is in reset mode, and the PMOS transistors M2, M3 pull up the output nodes (ZP, ZN) to the positive power supply VDD. When the clock signal CLK goes high, the PMOS transistors M2, M3 are turned off, the reset period ends, and the drain currents from the input differential pair (which is driven by inputs AP and AN) begin to discharge the load capacitors C. During this "integration" period (T long), charge is integrated (negatively) on the capacitors C. With a nonzero differential input voltage, the drain currents from the input differential pair are unequal, so the output nodes are discharged at different rates. A positive or negative differential output voltage is developed by the end of the integration period, as indicated by the voltage waveforms of ZP, ZN. At the end of the integration period, the differential output voltage is sampled by another circuit, such as a decision-making slicer or comparator if a binary output is desired, or a sample/hold circuit if an analog output is needed. Then when the clock signal CLK goes low, the PMOS switches M2, M3 are again turned on, and the capacitor voltages are reset to the positive power supply.

Integrating currents on parasitic capacitances is fundamentally much more power efficient than resistive current-to-voltage conversion. In the resistive scheme, the resistance value is deliberately chosen to be low enough that its impedance is much less than that of the parasitic capacitance over all frequencies of interest, which directly follows from the earlier requirement that the amplifier bandwidth be extended by making the RC time constant small. Consequently, much higher operating currents are needed to generate the same output voltage levels with resistive loads. With typical circuit parameters, the power dissipation of a current-integrating amplifier such as shown in FIG. 2A may be almost an order of magnitude lower than that of a resistively loaded amplifier such as shown in FIG. 1.

The differential input stage of the current-integrating amplifier 20 is used as a transconductor which converts the differential input voltage into drain currents which discharge the output nodes. Nonlinearity in this transconductor may limit the overall linearity of the current-integrating amplifier. If a current-integrating amplifier with high linearity and low distortion is needed, the simple differential pair of FIG. 2A may be replaced with a more linear transconductor circuit. For instance, FIG. 2B shows a current-integrating amplifier 22 in which the differential input stage includes a degeneration resistor RD, and two separate tail current sources 24 and 26, to provide resistive source degeneration, which is well-known to improve the linearity of the transconductor (at the cost of reduced gain).

Figure 2B:
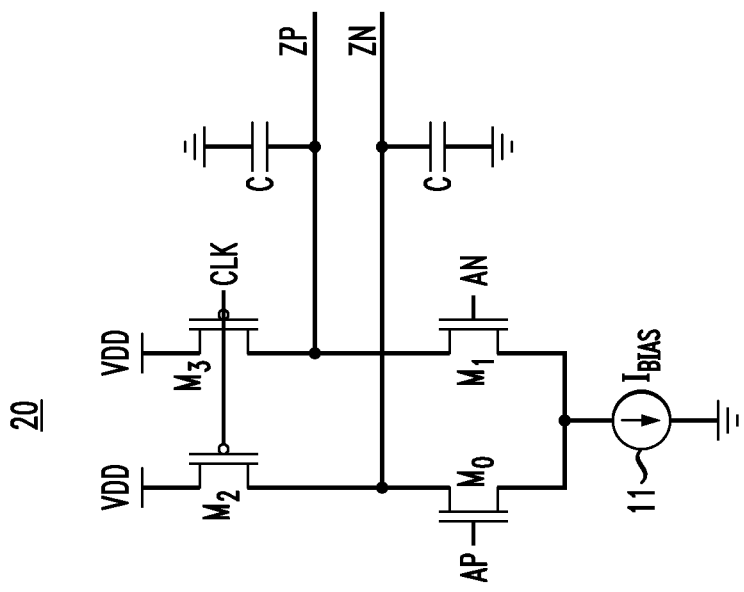
FIG. 2B is a schematic circuit diagram of a current-integrating amplifier with resistive source degeneration.

The current-integrating amplifiers of FIGS. 2A and 2B have a single (usually differential) input. A straightforward generalization of the circuit concept is the current-integrating summing amplifier, or summer, which receives multiple input signals. Typically, each input voltage is converted into a corresponding current by its own input stage, which acts as a transconductor. Since the transconductor output terminals are all connected to a common output node (or pair of nodes in a differential implementation), the currents from the different transconductors are summed by "dotting", and the discharge rate of the output node (or pair of nodes) during the integration interval represents the mathematical addition of the multiple input signals (weighted by the transconductances of their respective input stages). In this way, analog signal summation can be accomplished with the high power efficiency made possible with current-integrating circuits.

One important application in which the power efficiency of a current-integrating summer is a critical advantage is the design of a decision-feedback equalizer (DFE) which is used to improve the reception of multi-gigabit-per-second serial data. Due to limited channel bandwidth, the electrical pulses (representing bits) transmitted over a serial link are broadened over more than one unit interval (UI), and the received signal suffers from intersymbol interference (ISI). The basic idea behind the DFE is that once a data bit has been correctly identified as a 1 or a 0, its ISI with later bits in the data stream can be determined from the channel response and therefore can be compensated. The DFE accomplishes this compensation by feeding back the previously decided bits with appropriate delays and tap weights (H1, H2, . . . , HN), which are then added to the received input signal with an analog summing amplifier. The H1 tap represents the ISI contributed by a data bit one UI earlier than the current bit being detected, the H2 tap represents the ISI contributed by a data bit two UIs earlier than the current bit, and so on.

If the magnitudes and polarities of the tap weights are properly adjusted to match the channel characteristics, the ISI from previous bits in the data stream will be cancelled, and the current bit can be detected by a data slicer with a low bit error rate (BER). The adjustment of the tap weights can be performed either manually or automatically by an appropriate adaptive algorithm. A fundamental advantage of a DFE over a simple linear equalizer is that the ISI is compensated without amplifying noise or crosstalk. The main drawback of a DFE is its power dissipation, which reduces the energy efficiency of a serial link. Since a single integrated circuit may contain hundreds of serial link receivers, high energy efficiency is essential to meeting I/O power budgets in modern systems. Because the analog summing amplifier is one of the most power-hungry circuit blocks in a DFE, adopting a current-integrating summer can yield significant power savings. For this reason, current-integrating summers have been employed in many recent DFE designs.

However, all of the known current-integrating DFE architectures have one basic limitation, which will become a significant drawback as data rates are pushed to higher speeds (e.g., above 20 Gb/s). In particular, the designs do not scale well as the number of DFE taps that are speculated is increased (which will become necessary at such data rates). Without speculation (sometimes referred to "loop-unrolling" in the literature), compensation of the ISI in the H1 tap position requires that a data bit be decided, fed back with the appropriate weighting, and accurately summed with the analog input signal in only one UI (although in practice, less than one UI once one accounts for the setup time of the decision-making latch). Even in the latest deep submicron CMOS technologies, this timing constraint becomes difficult to satisfy for data rates above 10 Gb/s. To relax this timing constraint, speculation is introduced.

Figure 4:
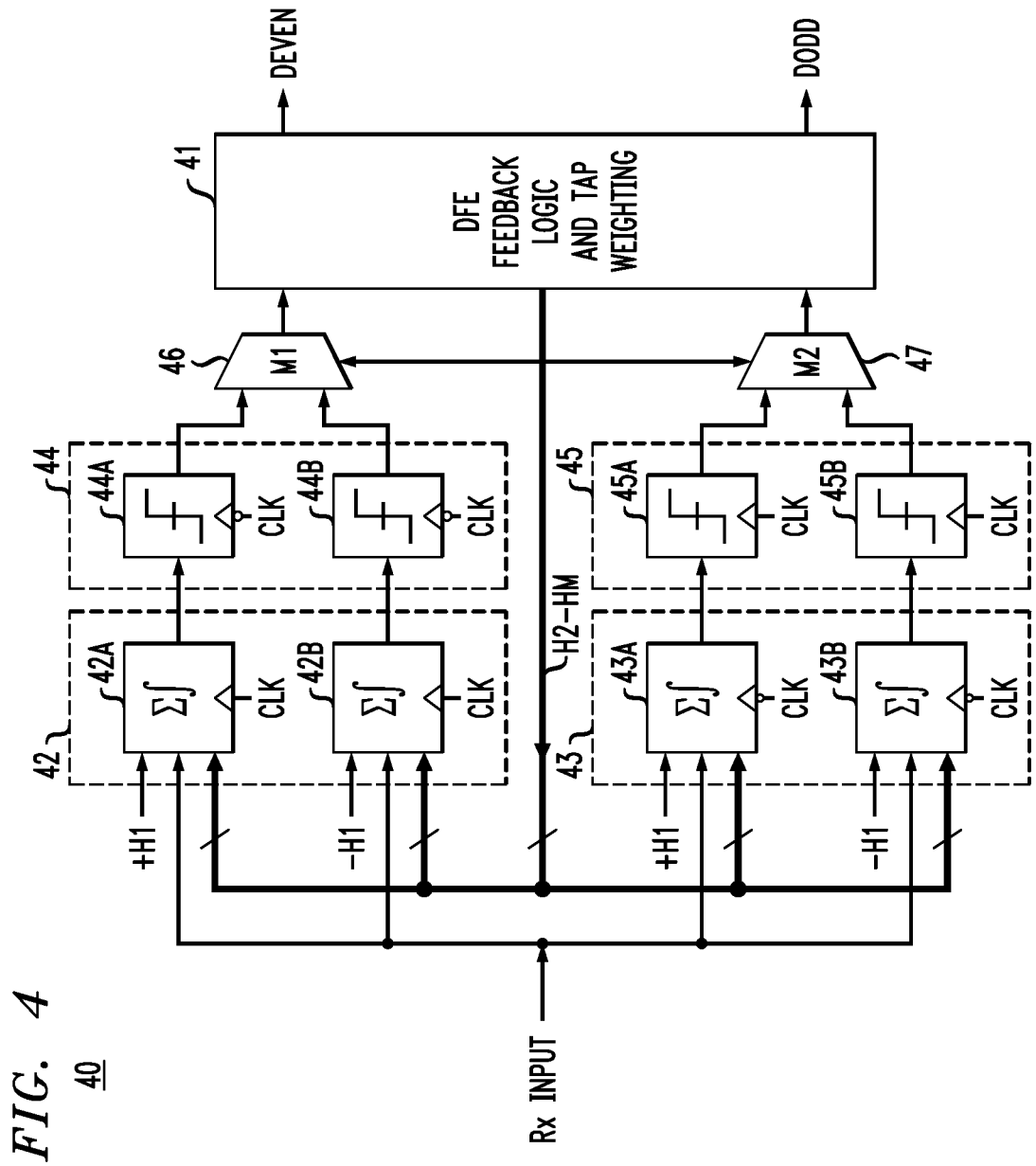
FIG. 4 is a block diagram of a half-rate M-tap DFE (decision feedback equalizer) architecture employing current-integrating summers and first-tap speculation.

FIG. 4 is a block diagram of a half-rate M-tap DFE (decision feedback equalizer) circuit 40 employing current-integrating summers and first-tap speculation to which principles of the present invention may be applied. The circuit 40 comprises a DFE block 41 that includes the feedback logic for generating weighted taps H2-HM, current integrating summer blocks 42 and 43, decision making latch blocks 44 and 45 and multiplexers M1 and M2. A half-rate architecture is a convenient choice when using the current-integrating summers 42 and 43, as clocking signals CLK can be arranged so that the current-integrating summers 42 used to detect the even data bits are integrating while the current-integrating summers 43 used to detect the odd data bits are resetting, and vice versa. With first-tap speculation, an H1 tap is not fed back to the current-integrating summers 42 and 43 as a dynamic signal. Instead, both +H1 and −H1 are added to the analog input signal (Rx input) as static offsets with a parallel pair of current-integrating summers 42A/42B in block 42, and a parallel pair of current-integrating summers 43A/43B in block 43. Since a previous bit in the data stream has only two possible values (0 or 1), one of these parallel paths represents the correct compensation of ISI, so a corresponding decision-making latch (44A or 44B in block 44, 45A or 45B in block 45) can detect the data with a low BER. Later in time, once the previous bit is known and available, the previous bit is used to select the MUX M1 (in the case of the even DFE half) and Mux M2 (in the case of the odd DFE half) so that the data bit detected with the correct value of ISI compensation is read out as the valid output of the DFE.

In the architecture of FIG. 4, the rest of the DFE taps (H2 through HM) are fed back to the current-integrating summers 42 and 43 as dynamic signals (not speculated). This is often a practical design choice, as the timing constraints for feeding back these taps are not as tight as the H1 timing constraint. For instance, the time available to close the H2 feedback loop is almost two UIs.

In DFEs employing current-integrating summers, all of the DFE taps (whether speculative or dynamic) are typically implemented as currents that are injected into the output nodes of the integrator. This design approach is illustrated in detail in FIG. 5, which is a transistor-level schematic of an embodiment of the two current-integrating summers 42A and 42B in the even half of the DFE architecture of FIG. 4 The current-integrating summers 42A and 42B include respective input stages 50 and 51 with resistive source degeneration RD for linear conversion of the received input voltage into drain currents which discharge the output nodes during the integration interval. The DFE feedback function is performed in the current-integrating summers 42A and 42B with simple differential pairs 52/54 and 53/55, respectively, which are used as current switches to steer tail currents $I_{H1}, I_{H2}, \ldots, I_{HM}$ to a positive output node INTOUTP1, INTOUTP2, or a negative output node INTOUTN1, INTOUTN2. The magnitudes of the DFE tap coefficients are proportional to these tail currents, which are often set with current digital-to-analog converters (I-DACs) to allow digital programmability. For DFE taps H2 through HM, the polarities of the current steering are dynamically controlled at high-speed by the previously detected data bits H2, H3, . . . , HM.

The speculative DFE tap H1, on the other hand, is never switched. For the summer 42A, the differential pair 52 of the H1 tap is hard-wired always to add a positive differential voltage (+H1) to the integrator output. For summer 42B, the differential pair 53 of the H1 tap is hard-wired always to add a negative differential voltage (−H1) to the integrator output. The output buffers 56 and 57 (e.g., CML buffers similar to that of FIG. 1) are optional elements but help stabilize the common-mode voltages presented to the inputs of the decision-making latches, which improves latch performance (e.g., sensitivity).

Figure 5:
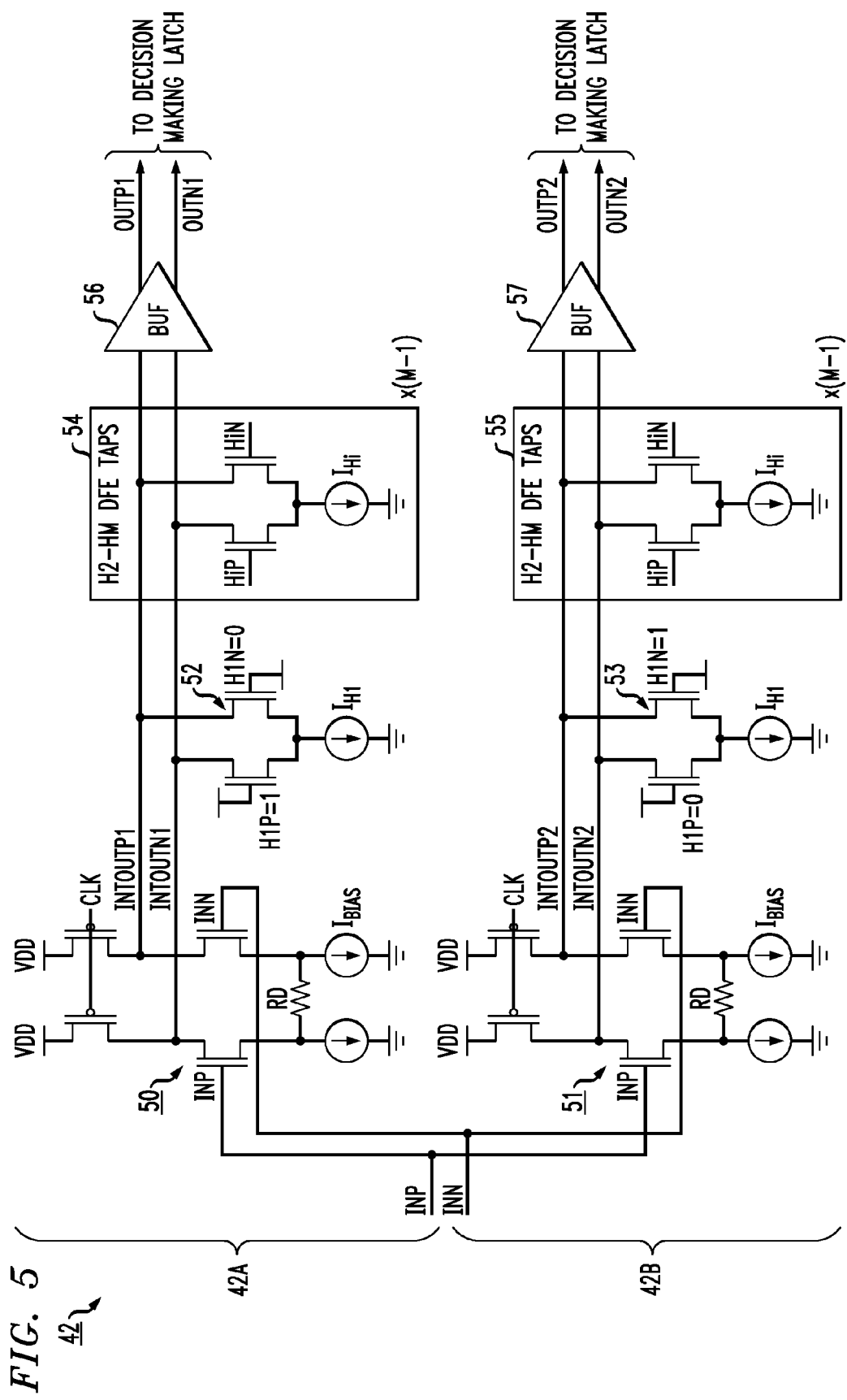
FIG. 5 is a schematic circuit diagram of current-integrating summers in the DFE architecture of FIG. 4.

The key point to note about the DFE architecture and circuits shown in FIGS. 4 and 5 is that a separate current-integrating summer is employed for each speculative (parallel) path. As clearly illustrated in FIG. 5, the hardware overhead is a factor of two when only the first tap is speculated. Since the current-integrating summers are relatively power-efficient, this factor of two overhead is not prohibitively costly in these designs. Unfortunately, the number of parallel paths grows exponentially ($2^S$) with the number (S) of speculative taps. For instance, to meet DFE timing requirements at data rates of 25-28 Gb/s, it becomes necessary to speculate at least the first two DFE taps (H1 and H2). With the conventional approaches discussed, this would require four current-integrating summers per DFE section (a half-rate architecture has two such sections, while a quarter-rate architecture has four such sections.) If one wants to speculate the first three DFE taps (H1, H2, and H3), which may relax timing constraints further and allow for more power-efficient implementation of the DFE feedback logic, one would require eight current-integrating summing amplifiers per DFE section. The area cost of so many summing amplifiers would be unacceptable for most applications. In addition, driving all of the wiring needed to carry the DFE feedback signals to so many summing amplifiers would lead to excessive power dissipation. Thus, conventional current-integrating DFE designs are not easily scaled to architectures with values of S much above 1.

Figure 6:
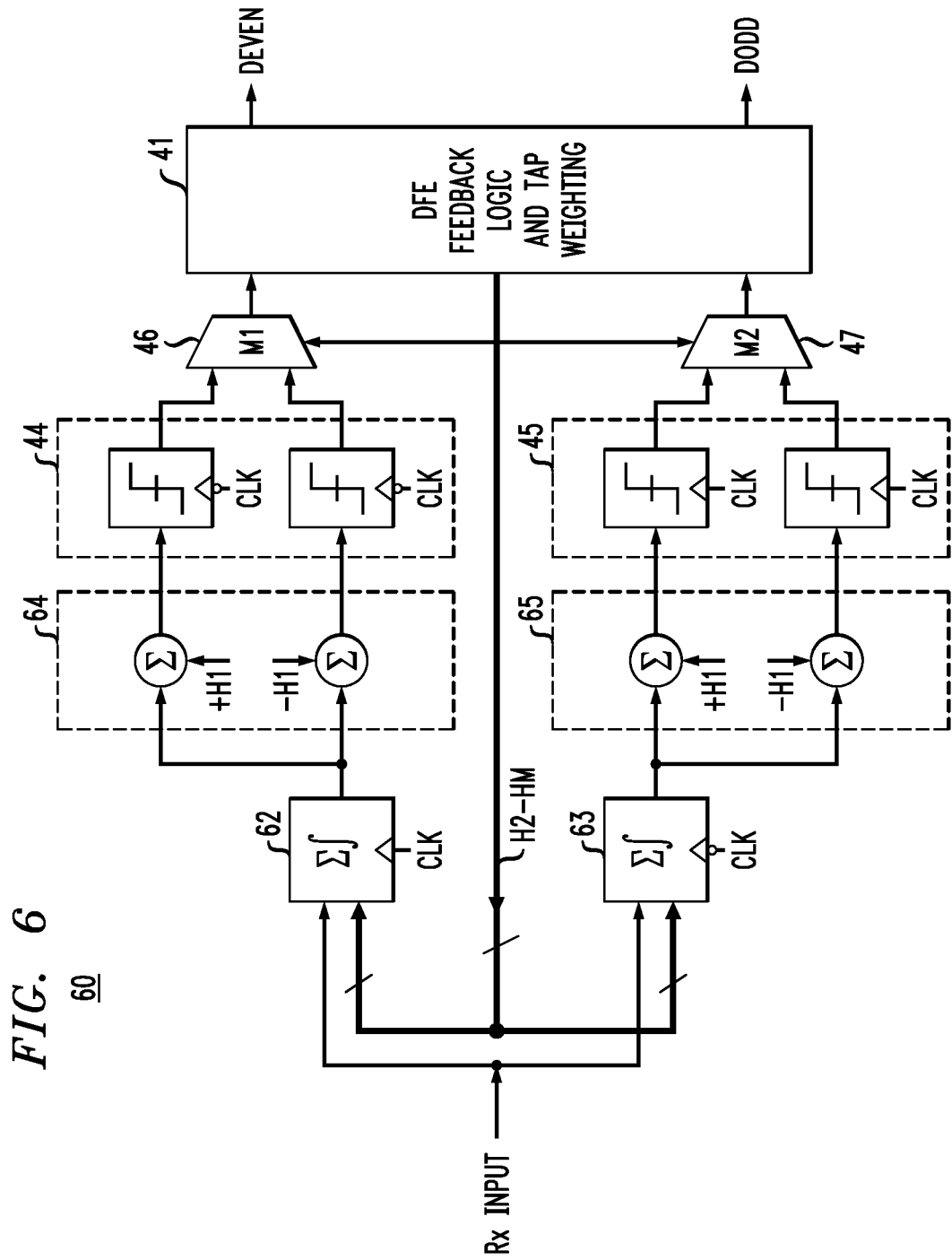
FIG. 6 is a block diagram of a half-rate M-tap DFE architecture in which one current-integrating summer drives multiple parallel paths used for speculation.

Conceptually, this scaling problem could be solved by implementing the DC offset required in each speculative path not within the current-integrating summer itself, but with a separate "offset summer" placed between the current-integrating summer and the decision-making latch associated with that speculative path. FIG. 6 is a block diagram of a half-rate M-tap DFE architecture 60, which is similar to that of FIG. 4, but wherein the first-tap speculation is accomplished with offset summers 64 and 65 adding either +H1 or −H1 to the output of a current-integrating summer 62 and 63, respectively, which are still responsible for adding the dynamic taps H2-HM to the received analog input signal (Rx input). Within each DFE half, there is only one current-integrating summer 62 and 63 driving the multiple (two in this case) parallel paths used for speculation. If more taps need to be speculated, the number of offset summers within blocks 64 and 65 would have to be increased, but there still would be only one current-integrating summer 62 and 63 (per DFE half). The scaling problem explained above would be solved, as long as the offset summer circuitry 64 and 65 can be realized with minimal costs in power, area, and complexity, and without degrading the maximum data rate of the DFE.

Designing a practical offset summer which satisfies these requirements is the key challenge, and conventional circuit techniques all have major drawbacks. While the offset summer could be implemented as a separate linear amplifier stage (such as the resistor-loaded summing amplifiers used in DFEs not based on current integration), the power dissipation of many such stages would greatly exceed that of the current-integrating summers, so the original power efficiency benefit of the current-integrating approach would be lost.

Another option would be to add threshold adjustment capability to the decision-making latches themselves, as an adjustment of the slicing level of a latch is mathematically equivalent to adding a DC offset to its input signal. While the cost in power and area would be small, adding this extra functionality to a latch tends to compromise its performance (e.g., clock-to-Q delay), for the threshold adjustment circuitry inside the latch adds parasitic capacitance to sensitive nodes. Therefore, this approach would degrade the maximum frequency with which the latch could be clocked and is not a preferred option for DFEs designed to operate at the highest data rates (e.g., 25-28 Gb/s).

In contrast, exemplary embodiments of the invention as discussed herein provide a power-efficient method for adding one or more DC offset voltages directly to the output of a single current-integrating summer, before the received data signal is applied to the input terminals of a decision-making latch. Since the latch itself is not modified, its high-frequency performance is not compromised. Therefore, exemplary embodiments of the present invention can be applied to solve the scaling problem of current-integrating DFE architectures. The present invention also provides benefits when used in other applications, as discussed below.

Figure 7A:
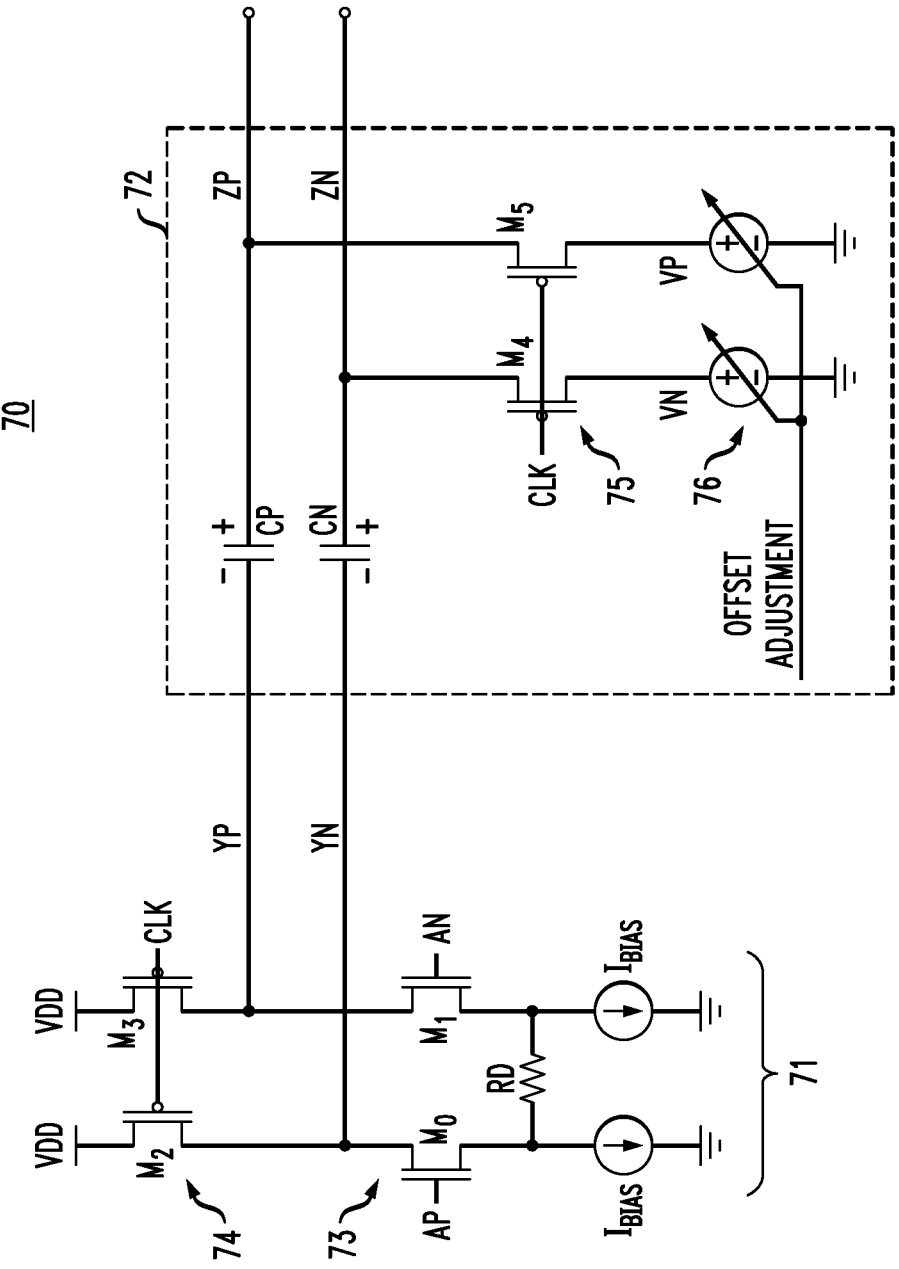
FIG. 7A is a schematic circuit diagram of a current-integrating amplifier with series capacitors for adding a DC offset to an output of the current-integrating amplifier, according to an exemplary embodiment of the invention.

FIG. 7A is a schematic circuit diagram of a current-integrating amplifier according to an exemplary embodiment of the invention. In particular, FIG. 7A illustrates a current-integrating amplifier 70 having an input amplifier stage 71 and an output offset circuit 72 connected to an output YP/YN of the input amplifier stage 71. The input amplifier stage 71 comprises a differential amplifier 73 formed by transistor pair M0/M1, a degeneration resistor RD, and tail current sources $I_{BIAS}$. The gate terminals of the differential transistor pair M0/M1 (nodes AP and AN, respectively) are differential inputs that receive as input a differential voltage. The drains of transistors M0 and M1 are connected to the output nodes YN and YP, respectively, of the input amplifier stage 71. The sources of transistors M0 and M1 are connected to the degeneration resistor RD and respective tail current sources $I_{BIAS}$. The degeneration resistor RD provides resistive source degeneration for improved linearity of the amplifier response. The tail current sources $I_{BIAS}$ generate bias currents for DC biasing the differential amplifier stage 71. The input amplifier stage 71 further includes a first reset circuit 74 comprising a pair of PMOS switches M2 and M3. The first reset circuit 74 is connected between a power supply node VDD and the output nodes YP/YN of the input amplifier stage 71. A clock signal CLK drives the gate of each PMOS switch M2 and M3.

The output offset circuit 72 comprises a pair of series capacitors CP/CN that are connected between respective output nodes YP/YN of the input amplifier stage 71 and respective output nodes ZP/ZN of the current-integrating amplifier circuit 70. The output nodes YP and YN of the input amplifier stage 71 are capacitively coupled to the output nodes ZP and ZN of the current-integrating differential amplifier 70 through respective series capacitors CP and CN. The output offset circuit 72 further comprises a switching circuit 75 comprising a pair of PMOS transistors M4/M5, and a bias voltage circuit 76 comprising first and second bias voltage sources VN and VP. The PMOS switches M4 and M5 of the switching circuit 75 are serially connected between respective output nodes ZN and ZP of the current-integrating amplifier circuit 70, and respective first and second variable bias voltage sources VN and VP.

With the circuit topology of FIG. 7A, non-zero voltages are stored across the series capacitors CP and CN, so that the voltages at nodes ZP and ZN are level-shifted versions of the voltages at nodes YP and YN. If the voltages stored across the series capacitors CP and CN are unequal, the voltages at nodes ZP and ZN will exhibit a differential DC offset, added to the output YP and YN of the input amplifier stage 71. The voltages stored across the series capacitors CP and CN (and therefore the DC offset at nodes ZP and ZN) are set to desired values during a reset phase of the current-integrating amplifier 70, when the clock signal CLK is at a logic "low" value, as will be explained now in further detail below with reference to FIG. 7B.

Figure 7B:
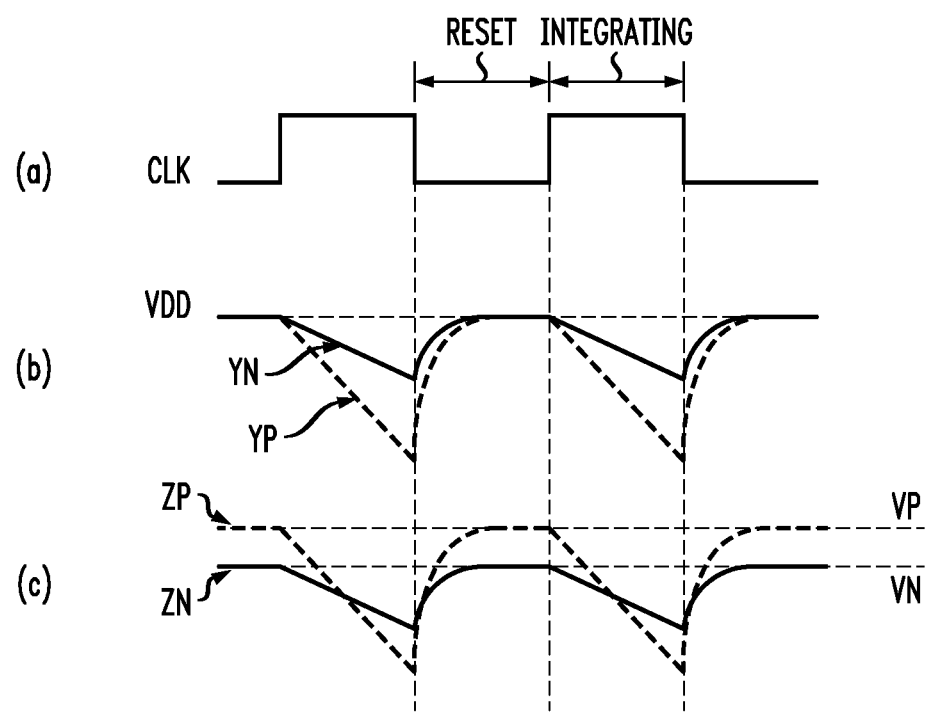
FIG. 7B shows example waveforms that illustrate an operating mode of the current-integrating amplifier of FIG. 7A.

FIG. 7B shows exemplary waveform diagrams illustrating an operating mode of the current-integrating amplifier 70 of FIG. 7A. In FIG. 7B, waveform (a) illustrates a clock signal CLK input to the gates of PMOS switches M2, M3, M4 and M5, waveform (b) illustrates voltage waveforms at the output nodes YN and YP, and waveform (c) illustrates voltage waveforms at the output nodes ZN and ZP. During a "reset" phase, when the clock signal CLK transitions to logic "Low", each of the PMOS switches M2, M3, M4 and M5 in FIG. 7A are turned "on". As a result, the nodes YP and YN are pulled up to the positive power supply voltage VDD, and the nodes ZP and ZN are connected to the bias voltage sources VP and VN, respectively. This causes the series capacitor CP to charge to VP-VDD, and the series capacitor CN to charge to VN-VDD. The differential DC offset at nodes ZP/ZN equals VP-VN (the difference between the voltages stored across the series capacitors).

Next, during an "integrating" phase, when the clock signal CLK transitions to logic "High", each of the PMOS switches M2, M3, M4 and M5 in FIG. 7A are turned "off," thereby disconnecting the output nodes YP and YN from the power supply voltage VDD and disconnecting the output nodes ZP and ZN from the bias voltage sources VP and VN. As a result, the drain currents of the transistors M1 and M0 of the input differential pair 73 discharge the voltages at the output nodes YP and YN, respectively, of the input amplifier stage 71. Because output nodes ZP and ZN are disconnected from the bias voltage sources VP and VN, but still capacitively coupled to respective nodes YP and YN through respective series capacitors CP and CN, the voltages at nodes ZP and ZN follow a downward movement of the voltages at nodes YP and YN, respectively.

At the end of the "integrating" period, the differential voltage at nodes ZP/ZN will reflect the differential voltage generated at nodes YP/YN, but will differ by the DC offset established during the reset phase. Thus, if the inputs of another circuit are connected to nodes ZP and ZN, that circuit will receive the output of the current-integrating amplifier 70 with the desired addition of DC offset. It is to be noted that parasitic capacitances at nodes ZP and ZN create capacitive dividers so that the magnitudes of the output pulses at these nodes are attenuated. This attenuation can be minimized by selecting values of the series capacitances CP and CN to be several times larger than the parasitic capacitances (including the input capacitance of another circuit connected to the nodes ZP and ZN).

The process of charging and recharging the series capacitors CP and CN during the reset phase of the current-integrating amplifier 70, when there is zero (differential in this case) signal on the output YP/YN of the input amplifier stage 71, ensures that the voltages stored on the series capacitors CP and CN are independent of the input signal received at the input amplifier stage 71 of the current-integrating amplifier 70. Because the voltages stored on the series capacitors CP and CN are not modulated by the input signal, the desired DC offset is added to the output of the current-integrating amplifier without distortion. This timing of the charging/recharging is also beneficial in reducing power dissipation.

Since the nodes YP and YN (first terminals of the series capacitors CP and CN) return to the positive power supply voltage VDD every cycle, it follows that once the series capacitors CP and CN have been charged to their desired voltages, the nodes ZP and ZN (second terminals of the series capacitors CP and CN) will also return to their desired levels, even without turning on the PMOS switches M5 and M4 connected to VP and VN. In fact, the PMOS switches M5 and M4 connected to respective bias voltage sources VP and VN only need to supply enough current to restore the charge lost to leakage. As a result, the PMOS switches M5 and M4 can be quite small, and the bias voltage sources VP and VN can have relatively high output impedance. This allows the recharging circuitry to be implemented with little power dissipation, and the small size of the PMOS switches M5 and M4 minimizes the parasitic loading on nodes ZP and ZN. If the PMOS switches M5 and M4 are small, and the bias voltage sources VP and VN have relatively high output impedance, it may take multiple integrator cycles for the DC offset at nodes ZP/ZN to stabilize whenever VP or VN is changed. This is perfectly acceptable in the vast majority of applications, which do not require rapid modification of DC offset adjustments. Hence, the circuit topology of FIG. 7A provides a way of adding a DC offset to the output of a current-integrating amplifier at a low cost in power consumption.

Figure 8:
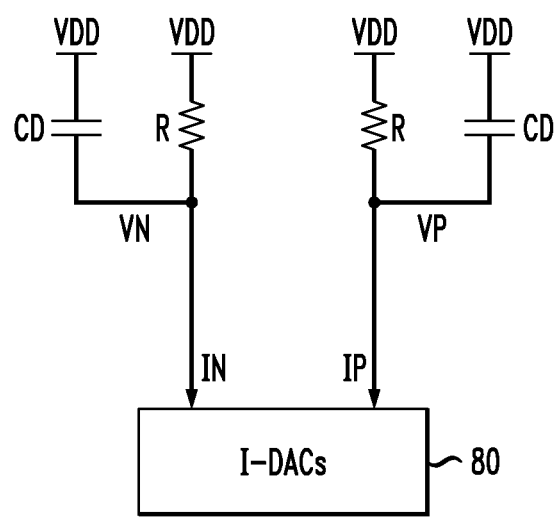
FIG. 8 is a schematic circuit diagram of a digitally programmable bias circuit for generating DC bias voltages VN and VP used in the current-integrating amplifier of FIG. 7A, according to an exemplary embodiment of the invention.

FIG. 8 is a schematic circuit diagram of a digitally programmable bias circuit for generating DC voltages VN and VP used in the current-integrating amplifier of FIG. 7A, according to an exemplary embodiment of the invention. In particular, FIG. 8 illustrates an exemplary embodiment of the variable bias voltage circuit 76 of FIG. 7A comprising an I-DAC circuit 80, resistors R and capacitors CD. With the circuit 76 shown in FIG. 8, the voltages VP and VN are generated by developing voltage drops across the resistors R connected to the positive power supply VDD. To provide digital programmability, the currents IP and IN pulled through the resistors R are digitally set with a plurality of I-DACs 80. By Ohm's law, VN=VDD−IN·R, and VP=VDD−IP·R.

Because these bias voltage sources do not need low output impedance, R can have a high value, and IP and IN can be small currents. The capacitors CD shown in FIG. 8 are an optional feature but can be implemented to serve as decoupling elements which protect VP and VN against disturbances. In one exemplary embodiment as shown in FIG. 8, the bias voltages VP and VN that are generated by the circuit 76 are referenced to (and decoupled to) the positive power supply voltage VDD. In another exemplary embodiment, the resistors R can be connected to ground, such that the bias voltages VP and VN would be ground-referenced. In this case, the I-DACs 80 would be chosen to be sources (not sinks) of currents IN and IP.

It is to be appreciated that this method of adding a single DC offset to the output of a current-integrating amplifier 70 (such as shown in FIG. 7A) provides advantages over a conventional solution of FIG. 5 of injecting a DC current directly into an output node of the current-integrating amplifier. For instance, the common-mode voltage at nodes ZP and ZN of FIG. 7A can be raised (or lowered) relative to that of nodes YP and YN (i.e., the common-mode naturally generated by a current-integrating amplifier) by raising (or lowering) both bias voltages VP and VN. This extra flexibility allows the common-mode at nodes ZP and ZN to be set to a value which optimizes the performance (e.g., sensitivity) of a subsequent circuit connected at nodes ZP and ZN. The power dissipation may also be reduced, if the current consumed in the circuitry generating VP and VN is lower than the injected current of the conventional solution.

Figure 9:
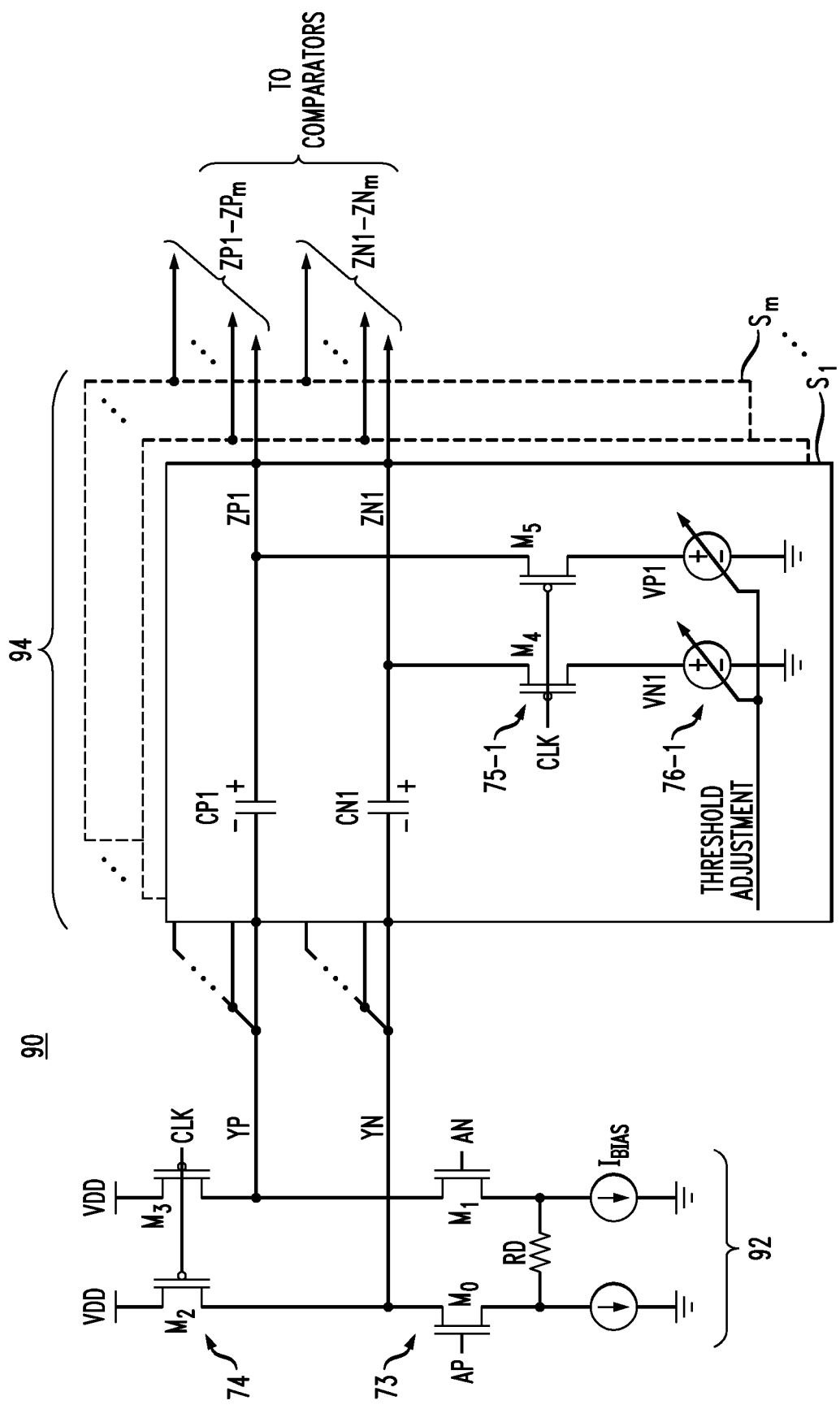
FIG. 9 is a schematic circuit diagram of a current-integrating amplifier with series capacitors for generating multiple differential outputs with different DC offsets, according to another exemplary embodiment of the invention.

It is to be appreciated that the exemplary circuit topology of FIG. 7A can be extended to add multiple DC offsets to the output of a single current-integrating amplifier, as illustrated in the exemplary embodiment of FIG. 9. In particular, FIG. 9 is a schematic circuit diagram of a current-integrating amplifier 90 with series capacitors for generating multiple differential outputs with different DC offsets, according to another exemplary embodiment of the invention. The current-integrating amplifier 90 of FIG. 9 is similar to the circuit 70 of FIG. 7A in that the current-integrating amplifier 90 has an input amplifier stage 92 similar to that of FIG. 7A, except that the circuit 90 of FIG. 9 includes a plurality of parallel output offset circuit stages S1, . . . , Sm, wherein each stage is similar to the output offset circuit shown in FIG. 7A.

More specifically, in this differential circuit implementation of FIG. 9, the output nodes YP and YN of the input amplifier stage 92 are connected through m pairs of series capacitors CP1/CN1, CP2/CN2, . . . , CPm/CNm to m pairs of nodes ZP1/ZN1, ZP2/ZN2, . . . , ZPm/ZNm. The voltages stored across each pair of series capacitors CP1/CN1, CP2/CN2, . . . , CPm/CNm determine the DC differential offsets at nodes ZP1/ZN1, ZP2/ZN2, . . . , ZPm/ZNm. As in the exemplary circuit embodiment of FIG. 7A, the voltages stored across the series capacitors CP1/CN1, CP2/CN2, . . . , CPm/CNm are set to the desired values during the reset phase of the current-integrating amplifier 90, when the clock signal CLK is at a low value. With all the PMOS transistors in blocks 92 and 94 turned "on," the nodes YP and YN are pulled up to the positive power supply voltage VDD, and the nodes ZP1/ZN1, ZP2/ZN2, . . . , ZPm/ZNm are connected to respective bias voltage sources VP1/VN1, VP2/VN2, . . . , VPm/VNm.

For instance, in the first output offset circuit stage S1, the PMOS transistors M5 and M4 are turned on to connect nodes ZP1 and ZN1 to bias voltage sources VP1 and VN1. Together, the series capacitors CP1 and CN1 connected to nodes ZP1 and ZN1, bias voltage sources VP1 and VN1, and their respective PMOS switches M5 and M4 constitute an "output offset circuit" for nodes ZP1 and ZN1. Similarly, the series capacitors CP2 and CN2 connected to nodes ZP2 and ZN2, bias voltage sources VP2 and VN2, and their respective PMOS switches constitute an "output offset circuit" (stage S2) for nodes ZP2 and ZN2, and so on. Since each output offset circuit stage S1, S2, . . . , Sm includes its own dedicated switching circuitry (75-1, 75-1, . . . , 75-m) and bias voltage sources (76-1, 76-2, . . . , 76-m), the DC differential offsets at nodes ZP1/ZN1, ZP2/ZN2, . . . , ZPM/ZNM can be set independently.

One possible application of the circuit 90 shown in FIG. 9 is a power-efficient implementation of a flash analog-to-digital converter (ADC). In a flash ADC, multiple (m) binary comparators are used to compare an analog input signal with m threshold levels. In most cases, the threshold levels are uniformly spaced, with the separation between levels determining the least significant bit (LSB) size of the ADC. Driving the combined input capacitance of multiple comparators is a major challenge in a flash ADC, and typically much power is consumed in the amplifiers (buffers) designed for this task. Significant power savings can be obtained if the m comparators are driven directly by the current-integrating amplifier 90 of FIG. 9. Specifically, the input of a first comparator could be connected to ZP1/ZN1, the input of a second comparator could be connected to ZP2/ZN2, and so on. The input-referred threshold of each comparator can be set to the desired level by adjusting VP1/VN1, VP2/VN2, . . . , VPm/VPm so that the corresponding differential DC offsets are added to the voltages at nodes ZP1/ZN1, ZP2/ZN2, . . . , ZPm/ZNm. In particular, these differential DC offsets can be set to uniformly spaced values, one LSB apart.

Figure 10:
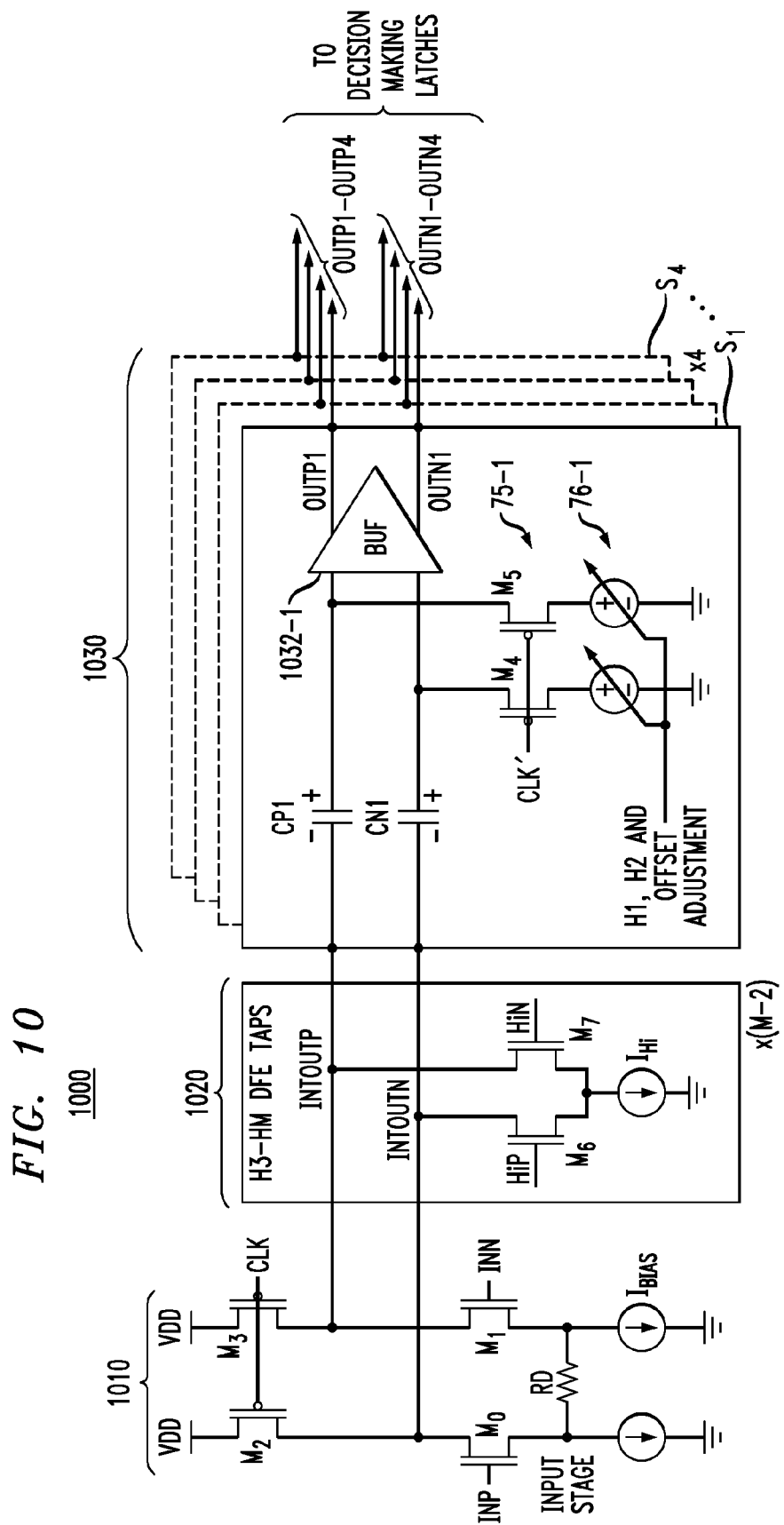
FIG. 10 is a schematic circuit diagram of a current-integrating summer for an M-tap DFE with two speculative taps, according to an exemplary embodiment of the invention.

FIG. 10 is a schematic circuit diagram of a current-integrating summer for an M-tap DFE with two speculative taps, according to an exemplary embodiment of the invention. In particular, FIG. 10 schematically illustrates a current-integrating summer 1000 comprising an input amplifier stage 1010, a feedback tap circuit 1020 that adds dynamic DFE feedback taps (H3-HM) to the received data signal, and a plurality of output offset circuits 1030 (stages S1, . . . , S4). The output offset circuits 1030 add the speculative taps (e.g., H1, H2) to the output nodes (INTOUTP/INTOUTN) of the input amplifier stage 1010 as DC offsets. The output offset circuits 1030 are similar to the output offset circuits 94 discussed with reference to FIG. 9. It is to be understood that the exemplary embodiment of FIG. 10 is based on the architectural approach discussed above with reference to FIG. 6.

In the exemplary embodiment of FIG. 10 having two speculative taps, four stages S1, S2, S3 and S4 of output offset circuits are employed. The pair of series capacitors CP1/CN1, . . . , CP4/CN4 inside each output offset circuit S1, . . . , S4 are used to capacitively couple the output nodes (INTOUTP/INTOUTN) of the input amplifier stage 1010 to one of four output buffers (1032-1, . . . 1032-4) driving four decision-making latches. The output buffers (1032-1, . . . 1032-4) are optional elements that help stabilize the common-mode voltages presented to the inputs of the decision-making latches.

In one of the output offset circuits S1, . . . , S4, the bias voltage sources are set so that the DC differential offset added to the outputs (INTOUTP/INTOUTN) of the input amplifier stage 1010 equals H1+H2. Similarly, the DC differential offsets added to the outputs (INTOUTP/INTOUTN) of the input amplifier stage 1010 by the other three output offset circuits equal H1−H2, −H1+H2, and −H1−H2. The values of H1 and H2 can be adjusted (either manually or automatically by an adaptive algorithm) so that each speculative path of the DFE receives the proper level of ISI compensation.

Moreover, the DC offset added in each speculative path can be further adjusted to correct for input-referred offset of the decision-making circuit (due to random mismatch, for instance). As in any speculative DFE architecture, MUXes placed after the decision-making latches (not shown in the figure) are used to select the data bit detected with the correct value of ISI compensation, once the previous two bits are known and available.

It is to be noted that in the exemplary embodiment of FIG. 10, the clock signal CLK used to drive the PMOS switches M2 and M3 in the input stage 1010 (which are used for resetting the output nodes (INTOUTP/INTOUTN) of the input amplifier stage 1010 to the power supply voltage VDD) differs from a clock signal CLK' that is used to drive the switches M4 and M5 in each of the output offset circuits 1030 (which are used to connect the right sides of the series capacitors to the bias voltage sources). In one exemplary embodiment, the clock signals CLK and CLK' are in phase with each other, but the falling edge of the clock signal CLK' is delayed relative to that of the clock signal CLK by appropriate delay or gating circuitry. The benefits of this clock timing protocol will be now be explained with reference to FIG. 11A.

Figure 11A:
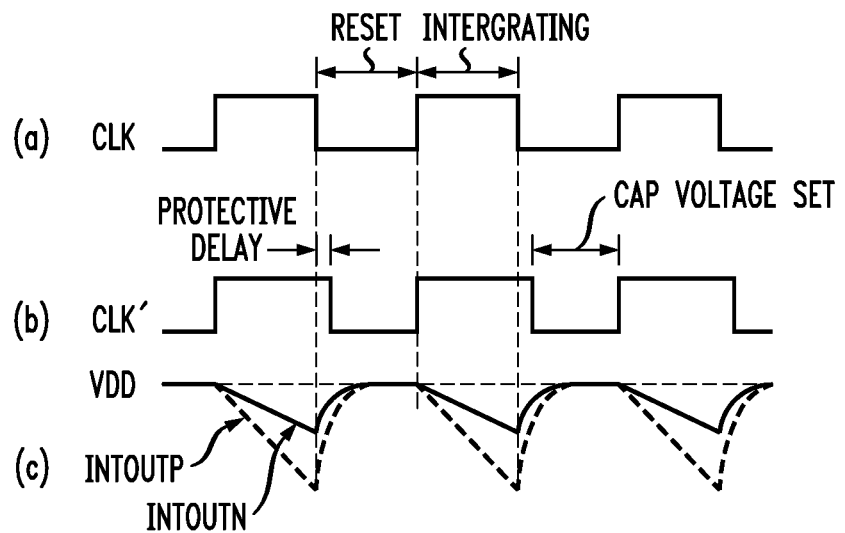
FIG. 11A shows example waveforms that illustrate an operating mode of the current-integrating summer of FIG. 10.

FIG. 11A shows example waveforms that illustrate an operating mode of the current-integrating summer of FIG. 10. In FIG. 11A, waveform (a) illustrates a first clock signal CLK input to the gates of PMOS switches M2 and M3, waveform (b) illustrates a second clock signal CLK' input to the PMOS switches M4 and M5, and waveform (c) illustrates voltage waveforms at the output nodes (INTOUTP/INTOUTN) of the input amplifier stage 1010. The voltages stored on the series capacitors CPi/CNi are set during the reset phase of the current-integrating summer. Since it is preferable that the recharging circuitry inside the output offset circuit 1030 employs small PMOS transistors (switches) M4 and M5 and relatively high impedance bias voltage sources, it is important to protect this circuitry against disturbances which would occur if the small PMOS transistors (switches) M4 and M5 were turned on while there was still a significant residual differential voltage on the output nodes (INTOUTP/INTOUTN) of the input amplifier stage 1010. If disturbed, this low-power recharging circuitry would be too slow to recover by the end of the reset period.

As shown in FIG. 11A, the skew between the falling edges of CLK and CLK' provides a "protective delay" which ensures that most of the integrated voltage from the previous integration period has been erased before the clock signal CLK' goes low and connects (by means of the small PMOS switches M4 and M5) the series capacitors to the bias voltage sources. This improves the accuracy with which the voltages stored across the series capacitors can be set. It is especially desirable that the voltages stored on the series capacitors be independent of the received data signal in order to avoid problems with ISI and baseline wander, which degrade the performance of serial link receivers.

Even with the "protective delay" provided by the skew between CLK and CLK', there may be another effect which hinders accurate recharging of the series capacitors. In many current-integrating amplifiers (or summers), including all the exemplary circuits described herein, the bias currents flowing through the input stage are not shut off during the reset phase. Because the PMOS transistors M2 and M3 that are used to pull the output nodes (INTOUTP/INTOUTN) of the input amplifier stage 1010 up to the positive power supply voltage VDD have nonzero on-resistance, IR drops exist across these PMOS transistors during the reset phase, so that the left sides of the series capacitors are not completely pulled up to the positive power supply voltage VDD. This incomplete reset of the output nodes (INTOUTP/INTOUTN) of the input amplifier stage 1010 alters the voltages stored across the series capacitors.

Figure 11B:
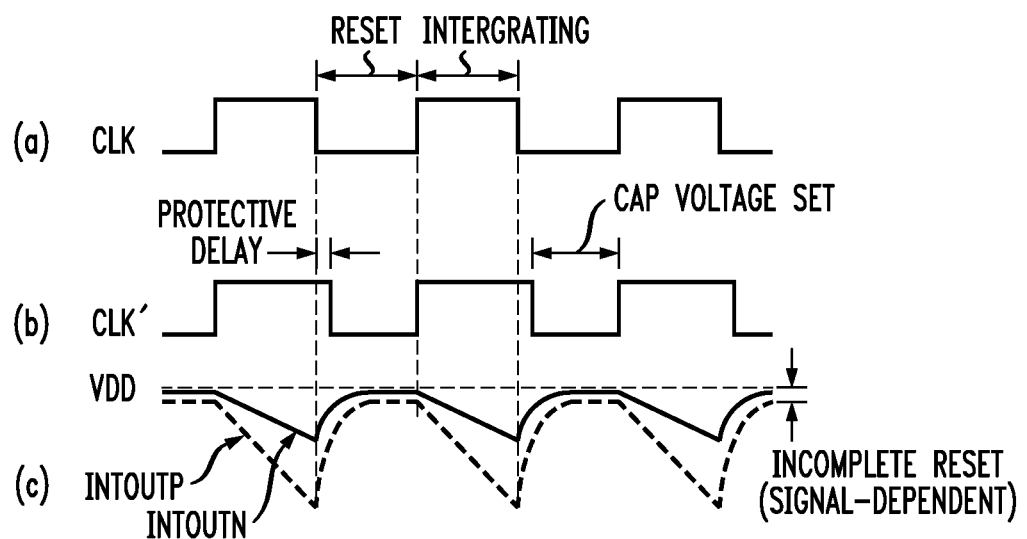
FIG. 11B shows example waveforms that illustrate an incomplete reset of the integrator output voltage in the circuit of FIG. 10.

Furthermore, the error due to incomplete reset is data-dependent, as it varies with the voltages applied to the input stage. If a large differential input is applied to the input stage, the drain currents from the input stage will be highly unequal and will generate much different IR drops across the PMOS transistors M2 and M3 used for resetting. In this case, the output nodes (INTOUTP/INTOUTN) of the input amplifier stage 1010 will be reset to different voltage levels, as illustrated in the example waveform diagram shown in FIG. 11B. In FIG. 11B, waveform (a) illustrates a first clock signal CLK input to the gates of PMOS switches M2 and M3, waveform (b) illustrates a second clock signal CLK' input to the PMOS switches M4 and M5, and waveform (c) illustrates voltage waveforms at the output nodes INTOUTP/INTOUTN. The waveform (c) of FIG. 11B shows the voltages at the output nodes INTOUTP/INTOUTN being reset at different levels below VDD. Because the exact voltages stored across the series capacitors become data-dependent, undesirable ISI is added to the received data signal. Since the recharging circuitry inside each output offset circuit is relatively weak, the ISI has long time constants (similar to baseline wander). The errors associated with incomplete reset of the output nodes (INTOUTP/INTOUTN) of the input amplifier stage 1010 can be avoided by replacing the output offset circuits 1030 of FIG. 10 with a modified embodiment shown in FIG. 12.

Figure 12:
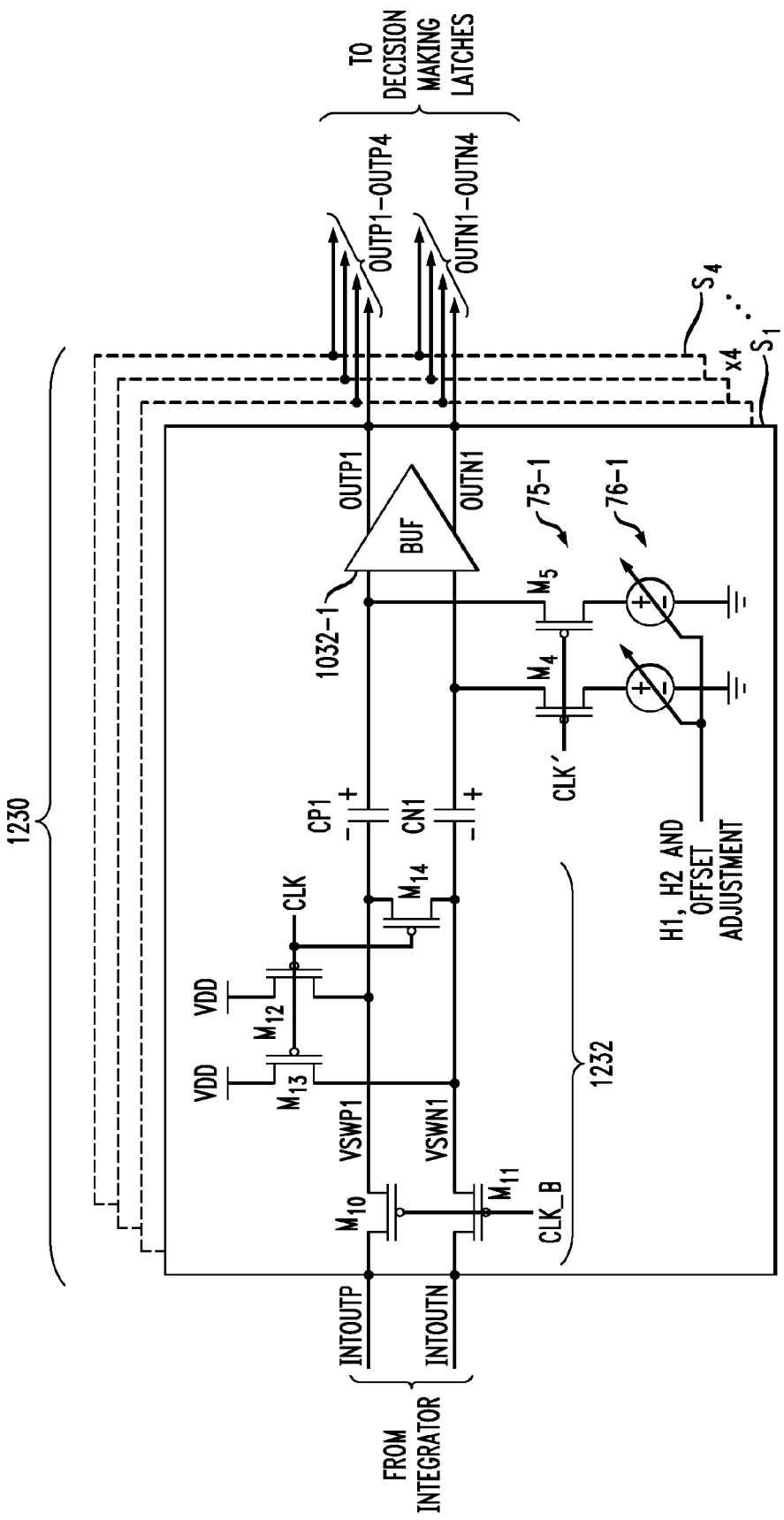
FIG. 12 is a schematic circuit diagram of an output offset circuit according to another exemplary embodiment of the invention.

In particular, FIG. 12 is a schematic circuit diagram of an output offset circuit 1230 according to another exemplary embodiment of the invention, which comprises an enhanced reset circuit 1232 for establishing accurate voltages across the series capacitors under operating conditions of an incomplete integrator reset. In the exemplary embodiment of FIG. 12, as shown in the first stage S1 of output offset circuits 1230, the reset circuit 1232 comprises PMOS transistors M10 and M11 (series switches) driven by CLK_B (the complement of CLK) which are connected in series between the output nodes INTOUTP/INTOUTN and the series capacitors CP1 and CN1, respectively. Moreover, as further shown in FIG. 12, the reset circuit 1232 comprises a PMOS switch M12 connected between the power supply node VDD and output node VSWP1, a PMOS switch M13 connected between the power supply node VDD and output node VSWN1, and a PMOS switch M14 connected between output nodes VSWP1 and VSWN1. The PMOS switches M12, M13 and M14 are driven by the clock signal CLK.

During an integration phase, the PMOS transistors M10 and M11 are turned on, so the output pulses of the current-integrating amplifier (or summer) are passed across the series capacitors CP1 and CN1, as discussed above with reference to the exemplary embodiments of FIGS. 7A and 9, for example. During the reset phase, however, these PMOS transistors M10 and M11 are turned off, so that nodes VSWP1/VSWN1 (or more generally, nodes VSWPi/VSWNi for the i$^{th}$ output offset circuit) are disconnected from the integrator output nodes INTOUTP/INTOUTN. At the same time, the PMOS switches M12, M13 and M14 driven by the clock signal CLK are turned on, which pulls the nodes VSWP1/VSWN1 up to the positive power supply voltage VDD. Since no bias currents flow through these PMOS transistors M12, M13 and M14, the accuracy with which nodes VSWP1/VSWN1 are reset to the positive power supply voltage VDD is not limited by IR drops.

Figure 13:
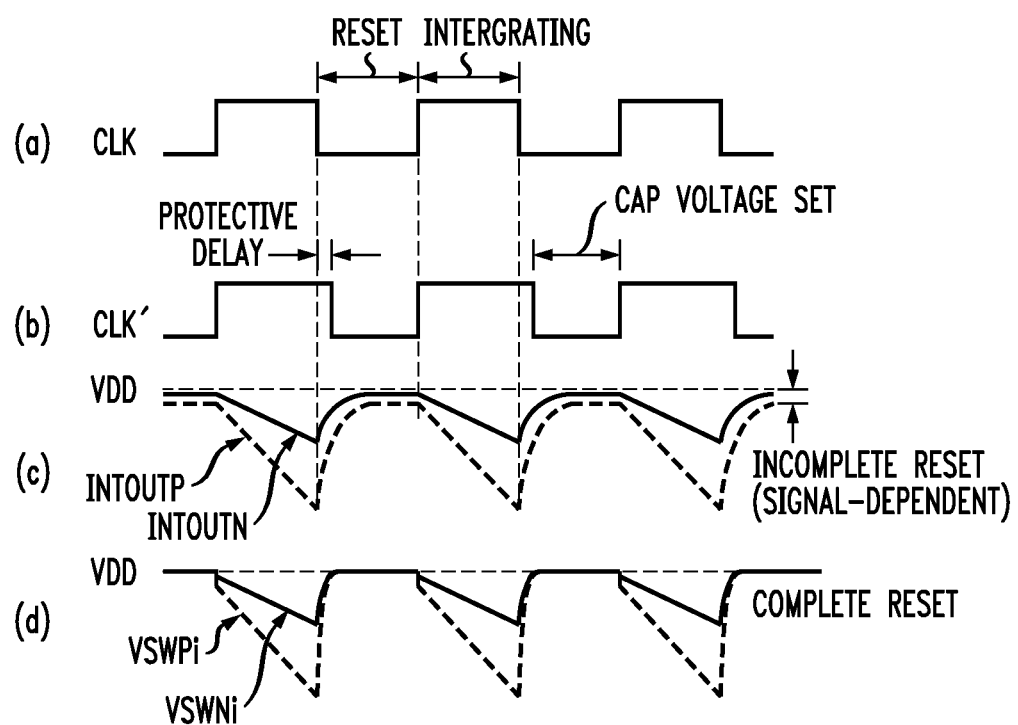
FIG. 13 shows example waveforms that illustrate an operating mode of a current-integrating summer employing the output offset circuit of FIG. 12, according to an exemplary embodiment of the invention.

This accurate resetting of the node pairs VSWPi/VSWNi in the output offset circuits 1230 of FIG. 12 is illustrated in the example waveform diagram for this circuit, shown in FIG. 13. In FIG. 13, waveform (a) illustrates a first clock signal CLK input to the gates of PMOS switches M12, M13 and M14, waveform (b) illustrates a second clock signal CLK' input to the PMOS switches M4 and M5, waveform (c) illustrates voltage waveforms at nodes INTOUTP/INTOUTN, and waveform (d) illustrates voltage waveforms at nodes VSWPi/VSWNi. As shown in FIG. 13, even when there is significant nonzero differential voltage at nodes INTOUTP/INTOUTN during the reset phase, the resetting of nodes VSWPi and VSWNi is unaffected and complete. Negligible differential voltage error at nodes VSWPi/VSWNi (at the left sides of the series capacitors) is further ensured by turning on the PMOS transistor M14 directly connected between VSWPi and VSWNi.

Another advantage of this embodiment as shown in FIG. 13 is that the parasitic capacitances at nodes VSWPi/VSWNi are typically much smaller than at nodes INTOUTP/INTOUTN, so the resetting of nodes VSWPi/VSWNi is significantly faster than the resetting of nodes INTOUTP/INTOUTN. Consequently, only a small "protective delay" (skew between CLK and CLK') is needed to ensure that the series capacitors are recharged with high accuracy, and almost no ISI is added to the received data signal.

Other straightforward modifications and variations of the disclosed embodiments, such as changing NMOS transistors to PMOS types, and vice versa, will be obvious to those skilled in the art. Such modifications and variations do not depart from the spirit and scope of the invention.

Further aspects of the present invention provide current-integrating amplifier circuits which can be utilized in integrated circuit chips with various analog and digital integrated circuitries. In particular, integrated circuit dies can be fabricated having current-integrating amplifier circuits and other semiconductor devices such as field-effect transistors, bipolar transistors, metal-oxide-semiconductor transistors, diodes, resistors, capacitors, inductors, etc., forming analog and/or digital circuits. The current-integrating amplifier circuits can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A current-integrating amplifier circuit, comprising:
an input amplifier stage having an input node, a first output node, and a first switch connected between the first output node and a power supply node; and
an output offset circuit connected to the first output node of the input amplifier stage and to a second output node of the current-integrating amplifier circuit, wherein the output offset circuit comprises:
a first series capacitor coupled between the first output node of the input amplifier stage and the second output node of the current-integrating amplifier circuit: and
a first bias voltage generator circuit to generate a first bias voltage on a first bias voltage node;
wherein the output offset circuit adds a DC offset to die second output node of the current-integrating amplifier circuit by switchably connecting the second output node to the first bias voltage node to charge the first series capacitor with the first bias voltage,
wherein the first switch is driven by a first clock signal to switchably connect the power supply node to the first output node during a "reset" period of operation of the current-integrating amplifier circuit.

2. The current-integrating amplifier circuit of claim 1, wherein the input amplifier stage comprises a differential amplifier.

3. The current-integrating amplifier circuit of claim 1, wherein the output offset circuit comprises:
a second switch connected between the first bias voltage node and the second output node of the current-integrating amplifier circuit.

4. The current-integrating amplifier circuit of claim 1, wherein the first bias voltage generator circuit is programmable to change the first bias voltage.

5. The current-integrating amplifier circuit of claim 3, wherein the second switch is driven by a second clock signal to switchably connect the first bias voltage node to the second output node during the "reset" period of operation.

6. The current-integrating amplifier circuit of claim 5, wherein the first clock signal and the second clock signal are the same.

7. The current-integrating amplifier circuit of claim 5, wherein the first clock signal and the second clock signal are in phase with each other, but wherein a falling edge of the second clock signal is delayed relative to a falling edge of the first clock signal.

8. The current-integrating amplifier circuit of claim 1, further comprising a second output offset circuit connected to the first output node of the input amplifier stage and to a third output node of the current-integrating amplifier circuit, wherein the second output offset circuit comprises:
a second series capacitor coupled between the first output node of the input amplifier stage and the third output node of the current-integrating amplifier circuit; and
a second bias voltage generator circuit to generate a second bias voltage on a second bias voltage node;
wherein the second output offset circuit adds a DC offset to the third output node of the current-integrating amplifier circuit by switchably connecting the third output node to the second bias voltage node to charge the second series capacitor with the second bias voltage.

9. The current-integrating amplifier circuit of claim 8, wherein the second output offset circuit comprises:
a third switch connected between the second bias voltage node and the third output node of the current-integrating amplifier circuit.

10. The current-integrating amplifier circuit of claim 9, wherein the second switch is driven by a second clock signal to switchably connect the first bias voltage node to the second output node during the "reset" period of operation, and wherein the third switch is driven by the second clock signal to switchably connect the second bias voltage node to the third output node during the "reset" period of operation.

11. The current-integrating amplifier circuit of claim 10, wherein the first clock signal and the second clock signal are the same.

12. The current-integrating amplifier circuit of claim 10, wherein the first clock signal and the second clock signal are in phase with each other, but wherein a falling edge of the second clock signal is delayed relative to a falling edge of the first clock signal.

13. The current-integrating amplifier circuit of claim 1, wherein the first series capacitor includes a first terminal and a second terminal,. wherein the current-integrating amplifier circuit further comprises:
a fourth switch connected between the first output node of the input amplifier stage and the first terminal of the first, series capacitor, wherein the second terminal of the first series capacitor is connected to the second output node of the current-integrating amplifier circuit; and
a fifth switch connected between the power supply node and the first terminal of the first series capacitor.

14. The current-integrating amplifier circuit of claim 13, wherein during an "integration" period of operation of the current-integrating amplifier circuit, the fourth switch is activated to connect the first output node of the input amplifier stage to the first terminal of the first series capacitor and the fifth switch is deactivated, and wherein during a "reset" period of operation of the current-integrating amplifier circuit, the fourth switch is deactivated to disconnect the first output node of the input amplifier stage from the first terminal of the first series capacitor and the fifth switch is activated to connect the power supply node to the first terminal of the first series capacitor.

15. An M-tap DFE (decision feedback equalizer) circuit comprising the current-integrating amplifier circuit of claim wherein the current-integrating amplifier circuit operates as a summer to add speculative DEE feedback taps as DC offsets to a received data signal.

16. A semiconductor integrated circuit chip, comprising an integrated circuit, the integrated circuit comprising a current-integrating amplifier circuit, the current-integrating amplifier circuit comprising:
an input amplifier stage having an input node, a first output node, and a first switch connected between the first output node and a power supply node; and
an output offset circuit connected to the first output node of the input amplifier stage and to a second output node of the current-integrating amplifier circuit, wherein the output offset circuit comprises:
a first series capacitor coupled between the first output node of the input amplifier stage and the second output node of the current-integrating, amplifier circuit; and
a bias voltage generator circuit to generate a bias voltage on a bias voltage node;
wherein the output offset circuit adds a DC offset to the second output node of the current-integrating amplifier circuit by switchably connecting the second output node to the bias voltage node to charge the first series capacitor with the bias voltage,
wherein the first switch is driven by a first clock signal to switchably connect the power supply node to the first output node during a "reset" period of operation of the current-integrating amplifier circuit.

17. The integrated circuit chip of claim 16, wherein the output offset circuit of the current-integrating amplifier circuit comprises:
   a second switch connected between the bias voltage node and the second output node of the current-integrating amplifier circuit.

18. The integrated circuit chip of claim 17, wherein the bias voltage generator circuit is programmable to change the bias voltage.

19. The integrated circuit chip of claim 17, wherein the second switch is driven by a second clock, signal to switchably connect the bias voltage node to the second output node during the "reset" period of operation.

20. The integrated circuit chip of claim 19 wherein the first clock signal and the second clock signal are the same.

21. The integrated circuit chip of claim 19, wherein the first clock signal and the second clock signal are in phase with each other, but wherein a falling edge of the second clock signal is delayed relative to a falling edge of the first clock signal.

* * * * *